United States Patent
Goto et al.

(10) Patent No.: US 7,683,379 B2
(45) Date of Patent: Mar. 23, 2010

(54) LIGHT EMITTING ELEMENT AND MANUFACTURING METHOD THEREOF

(75) Inventors: Kenji Goto, Kohtoh-ku (JP); Takuya Kawashima, Kohtoh-ku (JP); Nobuo Tanabe, Kohtoh-ku (JP); Tatsuya Ito, Kohtoh-ku (JP)

(73) Assignee: Fujikura Ltd., Tokyo (JP)

( * ) Notice: Subject to any disclaimer, the term of this patent is extended or adjusted under 35 U.S.C. 154(b) by 422 days.

(21) Appl. No.: 11/572,547

(22) PCT Filed: Jul. 27, 2005

(86) PCT No.: PCT/JP2005/013698

§ 371 (c)(1),
(2), (4) Date: May 1, 2007

(87) PCT Pub. No.: WO2006/011497

PCT Pub. Date: Feb. 2, 2006

(65) Prior Publication Data

US 2007/0284590 A1    Dec. 13, 2007

(30) Foreign Application Priority Data

| Jul. 30, 2004 | (JP) | 2004-223980 |
| Jul. 30, 2004 | (JP) | 2004-223981 |
| Jul. 30, 2004 | (JP) | 2004-223982 |
| Jul. 11, 2005 | (JP) | 2005-201581 |

(51) Int. Cl.
*H01L 27/15* (2006.01)
(52) U.S. Cl. .......................................... 257/79; 257/86
(58) Field of Classification Search .................. 257/79, 257/94, 98, 99, E33.062
See application file for complete search history.

(56) References Cited

U.S. PATENT DOCUMENTS 6,876,003 B1    4/2005    Nakamura et al.

(Continued)

FOREIGN PATENT DOCUMENTS

JP    2803742 B2    7/1998

(Continued)

OTHER PUBLICATIONS

Y.C. Lin et al., High Power Nitride Based Light Emitting Diodes with Ni/ITO P-Type Contacts, Solid-State Electronics, vol. 47, No. 9, 2003, pp. 1565 to 1568.

(Continued)

*Primary Examiner*—Zandra Smith
*Assistant Examiner*—Paul E Patton
(74) *Attorney, Agent, or Firm*—Sughrue Mion, PLLC

(57) ABSTRACT

A light emitting device having little variation in the intensity of light emitted from the light emitting surface is provided. The light emitting device of exemplary embodiments of the present invention includes a laminated body with a first conductivity type layer and a second conductivity type layer, with a light emitting portion therebetween. The light emitting device also includes a metal thin film layer on the second conductivity type layer of the laminated body, and a transparent conductor on the metal thin film layer. The transparent conductor includes a single layer of transparent conductive film. The grain size in the light emitting surface of the transparent conductive film is not less than 30 nm and not greater than 300 nm.

11 Claims, 5 Drawing Sheets

U.S. PATENT DOCUMENTS 7,538,360 B2 * 5/2009 Fudeta et al. .................. 257/99
2003/0170437 A1 9/2003 Kawashima et al.

FOREIGN PATENT DOCUMENTS

| JP | 10-321913 A | 12/1998 |
|---|---|---|
| JP | 2001-15813 A | 1/2001 |
| JP | 3207773 B2 | 7/2001 |
| JP | 2002-344019 A | 11/2002 |
| JP | 3394488 B2 | 1/2003 |
| JP | 2003-323818 A | 11/2003 |
| JP | 2004-103710 A | 4/2004 |
| JP | 2004-200325 A | 7/2004 |

OTHER PUBLICATIONS

Takuya Kawashima et al., New Transparent Conductive Films: FTO Coated ITO, Thin Solid Films, vol. 445, No. 2, 2003, pp. 241 to 244.

Kawashima T. et al., "FTO/ITO Double-Layered Transparent Conductive Oxide for Dye-Sensitized Solar Cells", Journal of Photochemistry and Photobiology, May 2004, pp. 199-202, vol. 164, Elsevier B.V.

Fukano, T. et al., "Ionization Potentials of Transparent Conductive Indium Tin Oxide Films Covered with a Single Layer of Fluorine-Doped Tin Oxide Nanoparticles Grown by Spray Pyrolysis Deposition", Journal of Applied Physics, Apr. 2005, pp. 084314-1 to 084314-6, vol. 97, No. 8, American Institute of Physics, New York.

* cited by examiner

LIGHT EMITTING ELEMENT AND MANUFACTURING METHOD THEREOF

CROSS-REFERENCE TO RELATED APPLICATIONS

This application claims priority from PCT Application No. PCT/JP2005/013698, filed Jul. 27, 2005; and from Japanese Patent Application Nos. 2004-223980, 2004-223981, and 2004-223982, filed Jul. 30, 2004; and from Japanese Patent Application No. 2005-201581, filed Jul. 11, 2005, the contents of which are incorporated herein in their entirety by reference.

BACKGROUND OF THE INVENTION

1. Field of the Invention

Apparatuses and methods consistent with the present invention relate to a compound semiconductor light emitting device for obtaining light from a compound semiconductor layer, and more particularly, to a compound semiconductor light emitting device which uses a transparent conductive film as a window electrode.

2. Description of the Related Art

Gallium nitride compound semiconductors, such as GaN, AlGaN, InGaN, and InGaAlN, are drawing attention as visible light emitting devices of green, blue, or the like.

In the manufacture of optical devices using these gallium nitride compound semiconductors, since there are a small number of substrates which have a lattice match with a gallium nitride compound semiconductor, sapphire is normally used as a substrate for crystal growth. Moreover, when an insulative substrate such as sapphire is used, unlike other light emitting devices using a conductive semiconductor substrate such as GaAs and InP, an electrode cannot be provided on the substrate side. Therefore, the p-side electrode and the n-side electrode to be provided on the semiconductor layer have to be formed on one surface side of the substrate on which the semiconductor layer is laminated.

Therefore, in order to suppress the reduction in the light transmissivity of emitting light, there is proposed a gallium nitride compound semiconductor light emitting device provided with a translucent electrode (for example, refer to Patent Document 1 below).

FIG. 1 is a cross-section showing an example of a related art gallium nitride compound semiconductor light emitting device provided with a translucent electrode. In the gallium nitride compound semiconductor light emitting device 300, on one surface (upper surface in FIG. 1) of a sapphire substrate 301 is provided an n-type GaN layer 305 via a GaN buffer layer 303, and on one surface (upper surface in FIG. 1) of this n-type GaN layer 305 are provided a p-type GaN layer 307 containing Mg as a p-type dopant, and an n-side electrode 309 formed from Ti/Au and the like. The periphery of the n-side electrode 309 is enclosed with an $SiO_2$ film 311a, so that it is electrically insulated from the p-type GaN layer 307.

On the other hand, on the p-type GaN layer 307 are provided an $SiO_2$ film 311b and a metal thin film layer 313 containing Mg. Furthermore, on this metal thin film layer 313 is provided a transparent conductive film 315 having a thickness of 100 nm, formed from an indium tin oxide (ITO) film for current diffusion. A p-side electrode 317 formed from Ti/Au and the like, is provided so as to cover the $SiO_2$ film 311b and a part of the transparent conductive film 315.

That is, in this structure, light emitting from a junction interface between the n-type GaN layer 305 and the p-type GaN layer 307 can be taken out through the transparent conductive film 315. In FIG. 1, the dotted lines show an electrical current flowing from the p-side electrode 317 through transparent conductive film 315 toward the junction interface. On the other hand, the alternate long and short dash lines show a state where light emitting from the junction interface mainly passes through the transparent conductive film 315 and radiates to the outside.

The transparent conductive film 315 formed from the indium tin oxide (ITO) film contains Sn as an n-type impurity, and thus generally is unable to be formed on the p-type GaN layer 317. Therefore, the metal thin film layer 313 containing Mg which is relatively easy to bring into ohmic contact with the p-type GaN layer 317, is formed in a thickness of 2 nm which is a thickness having 70% transmissivity with respect to the emitting light. Furthermore, in order to reduce the sheet resistance of the metal thin film layer 313, the transparent conductive film 315 having a thickness of 100 nm is formed.

After forming the transparent conductive film 315 on the deposited film of Mg/Ni=1 nm/2 nm, by performing annealing at 500° C. for 10 minutes, the adhesiveness and the ohmic contact between the metal thin film layer 313 and the p-type GaN layer 307 can be achieved. Since the metal thin film layer 43 contains Mg, if annealing is performed as it is, the metal thin film layer 313 is evaporated to vanish or to become thinner. However, since the transparent conductive film 315 provided on the metal thin film layer 313 acts as a protective film, the metal thin film layer 313 is prevented from being evaporated or vanishing. As a result, a reduction in the controllability of the metal film thickness on the electrode process, and the accompanying deterioration of the I-V characteristics of the light emitting device are avoided.

Moreover, a gallium nitride compound semiconductor light emitting device is proposed in which a transparent conductive film is provided as an electric current diffusion layer on a p-type GaN layer doped with Mg as a p-type dopant, by forming a first indium tin oxide (ITO) film by an evaporation method, and thereon a second indium tin oxide (ITO) film by a sputtering method (for example, refer to Patent Document 2 below).

FIG. 2 is a cross-section showing a gallium nitride compound semiconductor light emitting device 400 formed with such double layers of indium tin oxide. On one surface of the sapphire substrate 410 are sequentially provided: an AlN buffer layer 420; an Si-doped GaN layer 430 having a thickness of about 1.2 μm; an active layer 440 having a thickness of about 40 nm comprising a multiple quantum well (MQW) of n-type GaN and n-type InGaN; a cap layer 450 having a thickness of about 20 nm comprising a superlattice of AlN and p-type GaN; an Mg-doped GaN layer 460 having a thickness of about 200 nm; and a Zn film 470 having a thickness of several nm. A transparent conductive film 480 is provided thereon by forming: a lower indium tin oxide film 481 having a thickness of about 10 nm serving as a lower transparent conductive film; and an upper indium tin oxide film 482 having a thickness of about 500 nm serving as an upper transparent conductive film on this lower indium tin oxide film 481. Furthermore, on the partially exposed Si-doped GaN layer 430 is provided an n-type electrode 491, and on the upper indium tin oxide film 482 is provided a p-type electrode 492.

It is described that, since the lower indium tin oxide film 481 is formed by the evaporation method and the upper indium tin oxide film 482 is formed by the sputtering method, a compound semiconductor light emitting device 400 can be obtained in which the Mg-doped GaN layer 460 is less damaged, the operating voltage is lower, and the take-out efficiency of light to the outside is higher, in this case where the lower indium tin oxide film 481 is formed by the evaporation method, compared to the case where the transparent conductive film 480 is formed only by the sputtering method.

Furthermore, rather than a transparent conductive film formed from an indium tin oxide, there is proposed a gallium nitride compound semiconductor light emitting device provided with a translucent electrode formed from a metal (for example, refer to Patent Document 3 below).

As an example of such a device, FIG. 3 is a cross-section showing a gallium nitride compound semiconductor light emitting device 500 formed with a translucent electrode 505 by means of deposition of Ni and Au. On one surface of the sapphire substrate 501 are sequentially formed an n-type GaN layer 502 and a p-type GaN layer 503. On the p-type GaN layer is provided a metal translucent electrode 505 formed from Ni/Au. It is described that, the translucent electrode 505 is obtained by depositing Ni to a thickness of 30 nm on the p-type GaN layer 503, and depositing Au to a thickness of 70 nm on the Ni in a deposition apparatus, and after the deposition, annealing the resultant product at 500° C. for 10 minutes in an annealing apparatus for alloying and providing a transmissive property, so that a light emitting diode having satisfactory luminous efficiency and production yield can be produced.

However, in the above gallium nitride compound semiconductor light emitting devices 300, 400, and 500, the refractive index of the transparent conductors 315 and 480 and the translucent electrode 505 is about 2.0, and the refractive index of an air space is about 1.0, thus causing a problem in that, when light emitted in the light emitting layer passes through the transparent conductor or the translucent electrode and emits into the air space, the total reflectivity in the interface (light emitting surface) between the transparent conductor or the translucent electrode and the air space is increased and the intensity of light varies according to the direction.

The following documents describe the related art for the current invention:

Patent Document 1: Japanese Patent Publication No. 3207773

Patent Document 2: Japanese Patent Publication No. 3394488

Patent Document 3: Japanese Patent Publication No. 2803742

SUMMARY OF THE INVENTION

Exemplary embodiments of the present invention overcome the above disadvantages and other disadvantages not described above. Also, the present invention is not required to overcome the disadvantages described above, and an exemplary embodiment of the present invention may not overcome any of the problems described above.

An object of the present invention is to provide a light emitting device in which the total reflectivity in the light emitting surface formed by the transparent conductor is suppressed and the variation in intensity of light according to direction is little.

Moreover, another object of the present invention is to provide a compound semiconductor light emitting device in which, by improving the heat resistance of the transparent conductive film, even if annealing is applied in order to achieve the ohmic contact thereof with the metal thin film layer, the transparent conductive film can be kept from being oxidized, the increase in the specific resistance can be suppressed, and the stability of the transmissivity of the transparent conductive film functioning as the window electrode is excellent.

According to a first aspect of the present invention, the light emitting device comprises: a laminated body comprising a first conductivity type layer, a second conductivity type layer, and a light emitting portion disposed between the first conductivity type layer and the second conductivity type layer; a metal thin film layer provided on the second conductivity type layer of the laminated body; and a transparent conductor provided on the metal thin film layer. The transparent conductor comprises a single layer of transparent conductive film. The grain size in the light emitting surface of the transparent conductive film is no less than 30 nm and no more than 300 nm.

In such a structure, the light emitting portion is a layer positioned between the first conductivity type layer and the second conductivity type layer, or an interface between the first conductivity type layer and the second conductivity type layer.

The manufacturing method of the light emitting device of the first aspect of the present invention is a method of manufacturing a light emitting device, comprising: a laminated body comprising a first conductivity type layer, a second conductivity type layer, and a light emitting portion disposed between the first conductivity type layer and the second conductivity type layer; a metal thin film layer provided on the second conductivity type layer of the laminated body; and a single layer of transparent conductive film provided on the metal thin film layer. By changing the thickness of the transparent conductive film, the grain size in the light emitting surface of the transparent conductive film is controlled.

According to a second aspect of the present invention, the light emitting device comprises: a laminated body comprising a first conductivity type layer, a second conductivity type layer, and a light emitting portion disposed between the first conductivity type layer and the second conductivity type layer; a metal thin film layer provided on the second conductivity type layer of the laminated body; and a transparent conductor provided on the metal thin film layer. The transparent conductor comprises two or more transparent conductive films. The grain size in the light emitting surface of a transparent conductive film serving as an outermost layer is no less than 30 nm and no more than 300 nm.

In such a structure, the light emitting portion is a layer positioned between the first conductivity type layer and the second conductivity type layer, or an interface between the first conductivity type layer and the second conductivity type layer.

The manufacturing method of the light emitting device of the second aspect of the present invention is a method of manufacturing a light emitting device, comprising: a laminated body comprising a first conductivity type layer, a second conductivity type layer, and a light emitting portion disposed between the first conductivity type layer and the second conductivity type layer; a metal thin film layer provided on the second conductivity type layer of the laminated body; and a transparent conductor comprising two or more layers of transparent conductive films provided on the metal thin film layer. By changing the thickness of the transparent conductive film serving as an outermost layer in the transparent conductor, the grain size in the light emitting surface of the transparent conductive film is controlled.

According to a third aspect of the present invention, the light emitting device comprises: a laminated body comprising a first conductivity type layer, a second conductivity type layer, and a light emitting portion disposed between the first conductivity type layer and the second conductivity type layer; a metal thin film layer provided on the second conductivity type layer of the laminated body; and a transparent conductor provided on the metal thin film layer. The transparent conductor comprises two or more transparent conductive films. At least one layer in an upper layer has a higher heat resistance than that of a layer serving as the lowest layer.

In such a structure, the light emitting portion is a layer positioned between the first conductivity type layer and the second conductivity type layer, or an interface between the first conductivity type layer and the second conductivity type layer.

The manufacturing method of the light emitting device of the third aspect of the present invention is a method of manufacturing a light emitting device, comprising: a laminated body comprising a first conductivity type layer, a second conductivity type layer, and a light emitting portion disposed between the first conductivity type layer and the second conductivity type layer; a metal thin film layer provided on the second conductivity type layer of the laminated body; and a transparent conductor provided on the metal thin film layer. Forming the transparent conductor includes at least forming a transparent conductive film serving as a lowest layer, from indium tin oxide (ITO), indium oxide (IO), zinc oxide (ZO), antimony-doped zinc oxide (SbZO), Ga-doped zinc oxide (GZO), aluminum-doped zinc oxide (AlZO), or boron-doped zinc oxide (BZO), by a spray pyrolysis deposition method; and forming a transparent conductive film serving as at least one layer in the upper layer, from tin oxide (TO) or fluorine-doped tin oxide (FTO), by a spray pyrolysis deposition method.

In the light emitting device according to the first and second aspects of the present invention, when light emitted in the light emitting portion is emitted from the transparent conductor into the air space, the light is scattered by ruggedness due to the size of the crystal grain in the light emitting surface or the grain boundary, and thus light having little variation in intensity emits in multidirections.

Moreover, in the manufacturing method of the light emitting device according to the first and second aspects of the present invention, by changing the thickness of the transparent conductor, the grain size in the light emitting surface can be controlled, to reduce the variation in the emitting light.

In the light emitting device according to the third aspect of the present invention, since the constitutive transparent conductor is formed from two or more layers of transparent conductive films, the respective layers may have separately individual functions.

In particular, since the transparent conductive film serving as the lowest layer is highly conductive and highly transmissive, and the transparent conductive film serving as at least one layer in the upper layer has a higher heat resistance than that of the transparent conductive film serving as the lowest layer, the transparent conductive film serving as the lowest layer can be kept from being oxidized. Together with this, the increase in the specific resistance and the reduction in the light transmissivity can be suppressed.

Moreover, in the manufacturing method of the light emitting device according to the third aspect of the present invention, since a spray pyrolysis deposition method is used for all of the transparent conductive films constituting the transparent conductor, thin films can be formed in atmospheric air, and a depressurization system is unnecessary. Hence the production cost can be reduced.

DETAILED DESCRIPTION OF EXEMPLARY EMBODIMENTS OF THE INVENTION

Hereunder is a specific description of exemplary embodiments of the light emitting device of the present invention, with reference to the appended drawings. These exemplary embodiments are for specific explanation for better understanding of the scope of the invention, but in no way limit the present invention unless particularly specified.

First Aspect

Figure 1:
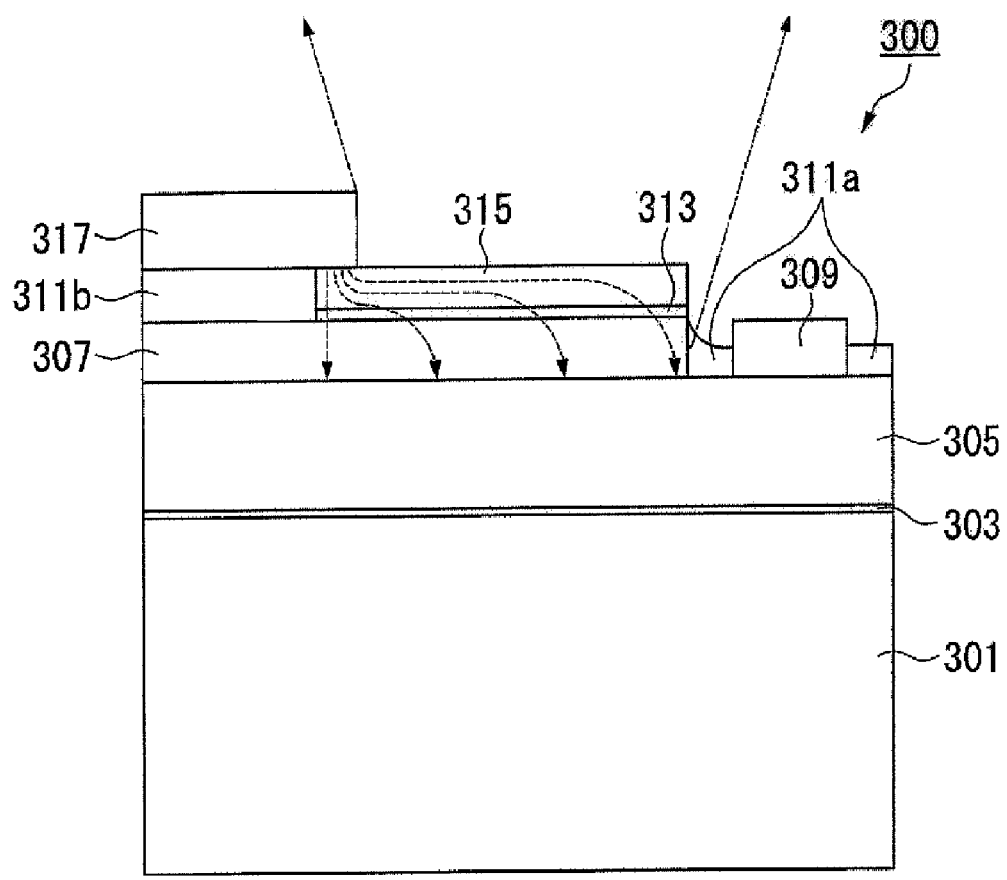
FIG. 1 is a cross-section showing an example of a related art gallium nitride compound semiconductor light emitting device.
Figure 2:
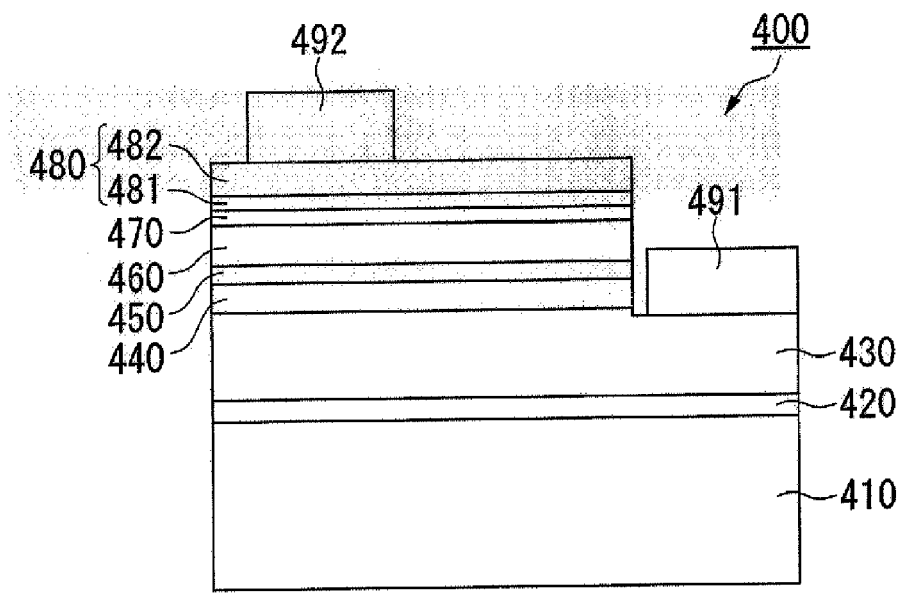
FIG. 2 is a cross-section showing another example of a related art gallium nitride compound semiconductor light emitting device.
Figure 3:
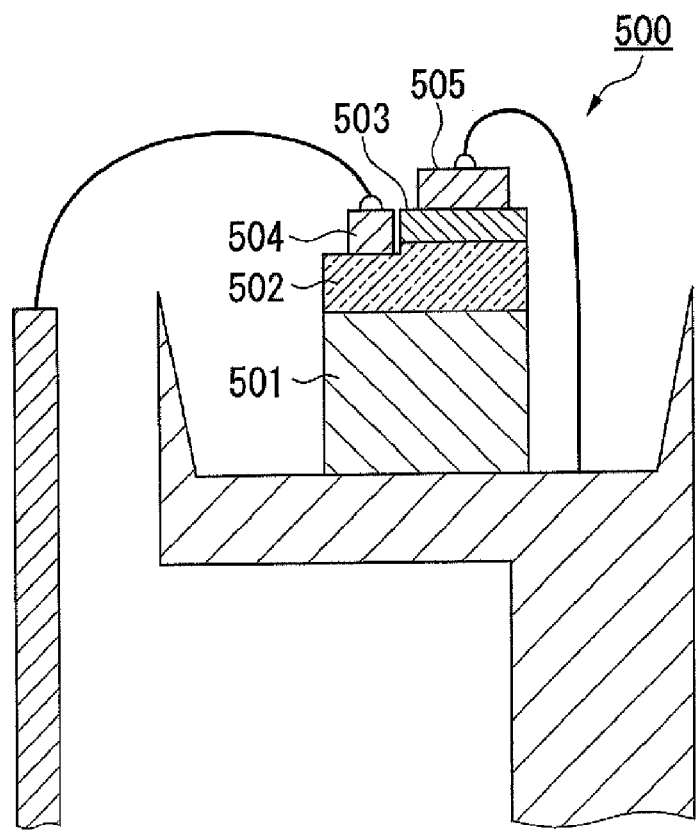
FIG. 3 is a cross-section showing yet another example of a related art gallium nitride compound semiconductor light emitting device.
Figure 4:
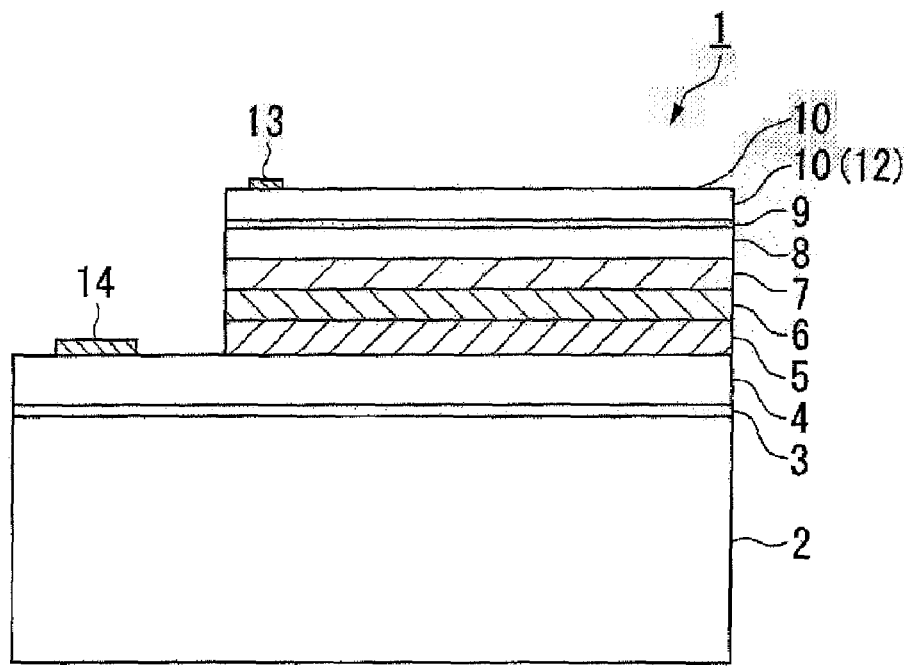
FIG. 4 is a cross-section showing an exemplary embodiment of a light emitting device according to a first aspect of the present invention.

FIG. 4 is a cross-section showing an exemplary embodiment of a light emitting device according to a first aspect of the present invention.

Hereunder is a description of the case where the light emitting portion forms a layer. However, in the case of interface emission, the interface between the first conductivity type layer and the second conductivity type layer functions as the light emitting portion.

In the light emitting device 1 of the first aspect of the present invention, on one surface (upper surface in FIG. 4) of a sapphire substrate 2 is provided an n-type GaN layer 4 having Si as a dopant via a GaN buffer layer 3, and via the n-type GaN layer 4 is provided an n-type AlGaN layer (main first conductivity type layer) 5 having Si as a dopant. Moreover, via this n-type AlGaN layer 5 is provided a light emitting portion 6 having a multiple quantum well (MQW) structure of InGaN and GaN, via the light emitting portion 6 is provided a p-type AlGaN layer (main second conductivity type layer) 7 containing Mg as a p-type dopant, via the p-type AlGaN layer 7 is provided a p-type GaN layer 8 containing Mg as a p-type dopant as well, via the p-type GaN layer 8 is provided a metal thin film layer 9 formed from Ni, and via the metal thin film layer 9 is provided a transparent conductor 12 comprising a single layer of transparent conductive film 10. On a part of the periphery of the surface of this transparent conductor 12 is provided a p-side electrode 13. On the other hand, the respective layers laminated on a part of the periphery of the n-type GaN layer 4 are removed, and on the exposed n-type GaN layer 4 is provided an n-side electrode 14.

Here, the transparent conductor 12 comprises any one type of metal oxide selected from indium tin oxide (hereunder, referred to as an ITO film), tin oxide (hereunder, referred to as a TO film), zinc oxide (hereunder, referred to as a ZnO film), antimony-doped zinc oxide (hereunder, referred to as an SbZO film), and fluorine-doped tin oxide (hereunder, referred to as an FTO film), and is formed in a film by a spray pyrolysis deposition method, a CVD method, a sputtering method, an evaporation method, a sol-gel method, a paste application method, or the like. By increasing the film thickness thereof, the grain size is increased.

In the light emitting device of the first aspect of the present invention, since the grain size in the light emitting surface is no less than 100 nm and no more than 200 nm, light is scattered more efficiently. Therefore the variation in intensity of emitting light can be further reduced.

Hereunder, the light emitting device is produced with different film thicknesses of the transparent conductor formed from the ITO film by the spray pyrolysis deposition method. In forming the ITO film by the spray pyrolysis deposition method, indium chloride (hydrate) and tin chloride (hydrate) were mixed so that the tin dosage was 5% by atom with respect to indium in element ratio, and then dissolved in an ethanol solution, and the solution was sprayed on the metal thin film layer 9 that had been heated at 350° C.

Example 1-1

A wafer was prepared in which on one surface of the sapphire substrate 2 were sequentially laminated the n-type GaN layer 4, the n-type AlGaN layer 5, the light emitting portion 6 having a multiple quantum well (MQW) structure of InGaN and GaN, the p-type AlGaN layer 7, the p-type GaN layer 8, and the metal thin film layer 9 formed from Ni. On this metal thin film layer 9 was formed a transparent conductive film 10 formed from an ITO film having a thickness of 100 nm. The grain size in the surface (light emitting surface 10') of the transparent conductive film 10 formed from the ITO film was 30 nm.

Next, on the transparent conductor 12 was formed a mask, and then etching was performed until the periphery of one surface of the n-type GaN layer 4 was exposed. On the exposed n-type GaN layer 4, aluminum was deposited to a thickness of about 0.4 µm, so as to form an n-side electrode 14. On the other hand, on a part of the periphery of the transparent conductor 12 (transparent conductive film 10) from which the mask was strip off, aluminum was deposited to a thickness of about 0.8 µm by a deposition method, so as to provide the p-side electrode 13.

The sapphire substrate 2 formed with this gallium nitride compound layer was diced into a 300 µm×300 µm square to form a bare chip. This bare chip was installed on a stem by means of die bonding, and wiring was performed by means of wire bonding to produce the light emitting device 1.

Example 1-2

The light emitting device 1 was produced in the same manner as that of Example 1-1, except that the thickness of the ITO film in Example 1-1 was 320 nm, and the grain size in the light emitting surface was 100 nm.

Example 1-3

The light emitting device 1 was produced in the same manner as that of Example 1-1, except that the thickness of the ITO film in Example 1-1 was 850 nm, and the grain size in the light emitting surface was 200 nm.

Example 1-4

The light emitting device 1 was produced in the same manner as that of Example 1-1, except that the thickness of the ITO film in Example 1-1 was 1000 nm, and the grain size in the light emitting surface was 300 nm.

Comparative Example 1-1

The light emitting device was produced in the same manner as that of Example 1-1, except that the thickness of the ITO film in Example 1-1 was 40 nm, and the grain size in the light emitting surface was 10 nm.

Comparative Example 1-2

The light emitting device was produced in the same manner as that of Example 1-1, except that the thickness of the ITO film in Example 1-1 was 1200 nm, and the grain size in the light emitting surface was 400 nm.

Evaluation and Evaluation Result

Figure 5:
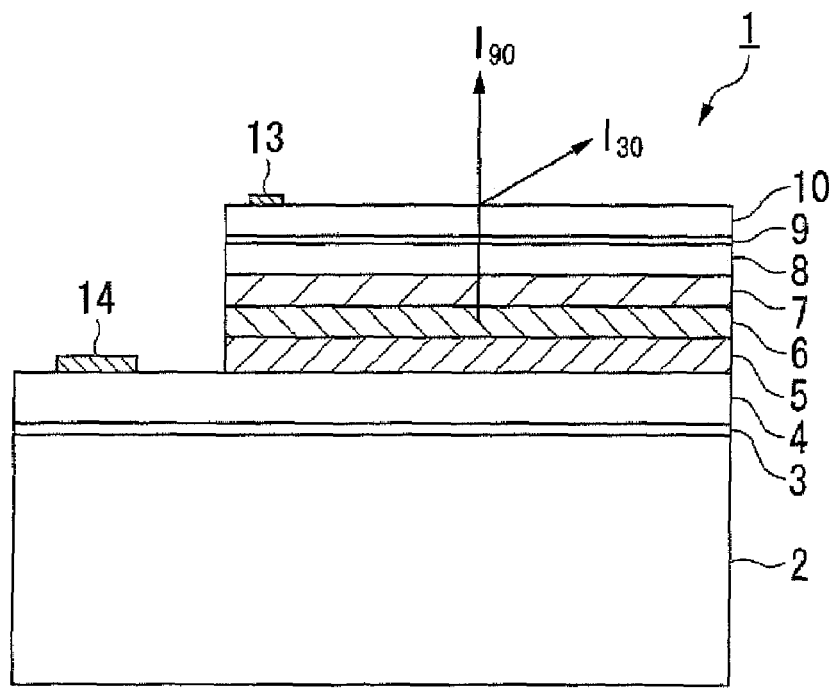
FIG. 5 shows an evaluation method of the exemplary embodiment of the first aspect of the present invention.

The light emitting devices produced in Examples 1-1 to 1-4 and Comparative Examples 1-1 and 1-2 were operated to emit light. As shown in FIG. 5, the intensity of light in the 90° (vertical) direction and the intensity of light in the 30° direction were measured. The evaluation was such that C is the ratio ($I_{30}/I_{90}$) of the intensity of light in the 30° direction to the intensity of light in the 90° (vertical) direction of less than 0.2, B is the ratio ($I_{30}/I_{90}$) of 0.2 or more and less than 0.5, and A is the ratio ($I_{30}/I_{90}$) of 0.5 or more. That is, it can be said that, as the ratio ($I_{30}/I_{90}$) becomes greater, polarization of the light according to the direction is decreased. The evaluation results are shown in Table 1.

TABLE 1

|  | Film thickness nm | Grain size nm | Evaluation result |
|---|---|---|---|
| Example 1-1 | 100 | 30 | B |
| Example 1-2 | 320 | 100 | A |
| Example 1-3 | 850 | 200 | A |
| Example 1-4 | 1000 | 300 | B |
| Comparative Example 1-1 | 40 | 10 | C |
| Comparative Example 1-2 | 1200 | 400 | C |

The transparent conductor 12 was formed from the transparent conductive film 10 comprising a TO film, a ZnO film, a SbZO film, or an FTO film, instead of the ITO film. All cases provided similar results to that of the ITO film. Moreover, the transparent conductive film 10 was formed by a CVD method, a sputtering method, an evaporation method, a sol-gel method, and a paste application method, instead of the spray pyrolysis deposition method. All cases provided similar results to that of the spray pyrolysis deposition method.

Second Aspect

Figure 6:
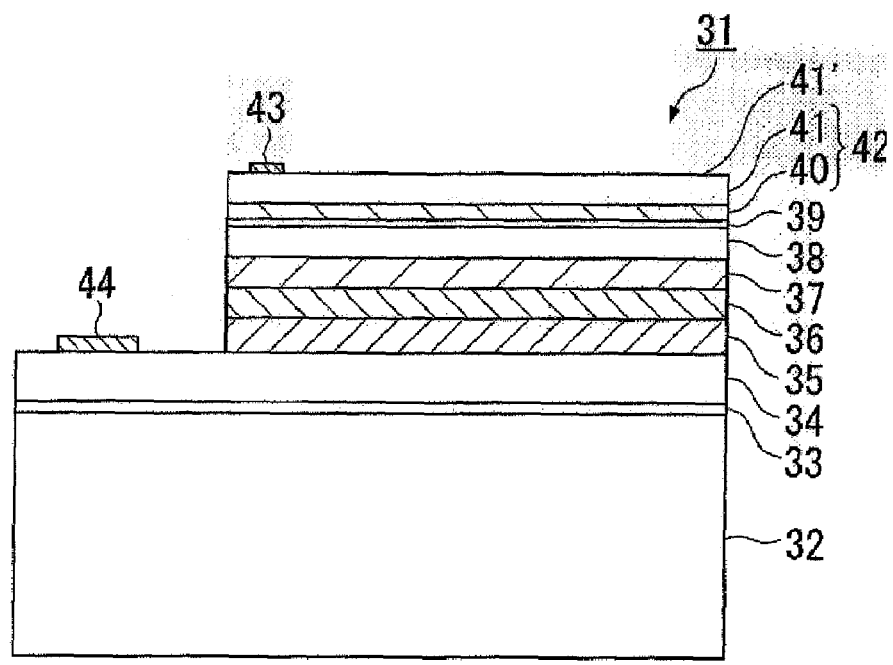
FIG. 6 is a cross-section showing an exemplary embodiment of a light emitting device according to a second aspect of the present invention.

FIG. 6 is a cross-section showing an exemplary embodiment of a light emitting device according to a second aspect of the present invention.

Hereunder is a description of the case where the light emitting portion forms a layer. However, in the case of interface emission, the interface between the first conductivity type layer and the second conductivity type layer functions as the light emitting portion.

In the light emitting device 31 of the second aspect of the present invention, on one surface (upper surface in FIG. 6) of a sapphire substrate 32 is provided an n-type GaN layer 34 having Si as a dopant via a GaN buffer layer 33, and via the n-type GaN layer 34 is provided an n-type AlGaN layer (main first conductivity type layer) 35 having Si as a dopant. Moreover, via this n-type AlGaN layer 35 is provided a light emitting portion 36 having a multiple quantum well (MQW) structure of InGaN and GaN, via the light emitting portion 36 is provided a p-type AlGaN layer (main second conductivity type layer) 37 containing Mg as a p-type dopant, via the p-type AlGaN layer 37 is provided a p-type GaN layer 38 containing Mg as a dopant as well, via the p-type GaN layer 38 is provided a metal thin film layer 39 formed from Ni, and via the metal thin film layer 39 is provided a two layer transparent conductor 42 of transparent conductive films 40 and 41.

On a part of the periphery of the surface of the transparent conductor 42 is provided a p-side electrode 43. On the other hand, the respective layers laminated on a part of the periphery of the n-type GaN layer 34 are removed, and on the exposed n-type GaN layer 34 is provided an n-side electrode 44.

Here, in the transparent conductor 42, the outermost layer is the transparent conductive film 41 formed from fluorine-doped indium oxide (hereunder, referred to as an FTO film) or tin oxide (hereunder, referred to as a TO film), and at least one layer in the inner layer is the transparent conductive film 40 formed from indium tin oxide (hereunder, referred to as an ITO film), a TO film, zinc oxide (hereunder, referred to as a ZnO film), antimony-doped zinc oxide (hereunder, referred to as an SbZO film), or an FTO film. Furthermore, each of the transparent conductive films is formed by a spray pyrolysis deposition method, a CVD method, a sputtering method, an evaporation method, a sol-gel method, a paste application method, or the like. By increasing the film thickness thereof, the grain size is increased.

In the light emitting device of the second aspect of the present invention, since the grain size in the light emitting surface is no less than 100 nm and no more than 200 nm, light is scattered more efficiently. Therefore the variation in intensity of emitting light can be further reduced.

Hereunder, the transparent conductor 40 formed from the ITO film in the inner layer and the transparent conductive film 41 formed from the FTO film in the outer layer were formed by the spray pyrolysis deposition method, and the light emitting device was produced with different film thicknesses of the transparent conductive film 41 formed from the FTO film.

In forming the ITO film, indium chloride (hydrate) and tin chloride (hydrate) were mixed so that the tin dosage was 5% by atom with respect to indium in element ratio, and then dissolved in an ethanol solution, and the solution was sprayed on the metal thin film layer 39 that had been heated at 350° C.

In forming the FTO film, ethanol solution of tin chloride (hydrate) and a saturated aqueous solution of ammonium fluoride were mixed so that the fluorine dosage was about several ppm to several thousands ppm with respect to tin, and the mixed solution was sprayed on the ITO film that had been heated at 550° C.

Example 2-1

A wafer was prepared in which on one surface of the sapphire substrate 32 were sequentially laminated the n-type GaN layer 34, the n-type AlGaN layer 35, the light emitting portion 36 having a multiple quantum well (MQW) structure of InGaN and GaN, the p-type AlGaN layer 37, the p-type GaN layer 38, and the metal thin film layer 39 formed from Ni. On this metal thin film layer 39 that had been heated at 350° C. was formed the ITO film 40 having a thickness of 350 nm. Then, the temperature of the ITO film was increased to 550° C., and on the ITO film was formed the FTO film 41 having a thickness of 120 nm. The grain size in the surface (light emitting surface 40') of the FTO transparent conductive film 41 was 30 nm.

Next, on the transparent conductor 42 was formed a mask, and then etching was performed until the periphery of one surface of the n-type GaN layer 34 was exposed. On the exposed n-type GaN layer 34, aluminum was evaporated to a thickness of about 0.4 μm, so as to form the n-side electrode 44. On the other hand, on a part of the periphery of the transparent conductor 42 (FTO film 41) from which the mask was strip off, aluminum was deposited to a thickness of about 0.8 μm by a deposition method, so as to provide the p-side electrode 43.

The sapphire substrate 32 formed with this gallium nitride compound layer was diced into a 300 μm×300 μm square to form a bare chip. This bare chip was installed on a stem by means of die bonding, and wiring was performed by means of wire bonding to produce the light emitting device 31.

Example 2-2

The light emitting device 31 was produced in the same manner as that of Example 2-1, except that the thickness of the FTO film in Example 2-1 was made 340 nm and the grain size in the light emitting surface was made 100 nm.

Example 2-3

The light emitting device 31 was produced in the same manner as that of Example 2-1, except that the thickness of the FTO film in Example 2-1 was made 820 nm and the grain size in the light emitting surface was made 200 nm.

Example 2-4

The light emitting device 31 was produced in the same manner as that of Example 2-1, except that the thickness of the FTO film in Example 2-1 was made 1100 nm and the grain size in the light emitting surface was made 300 nm.

Comparative Example 2-1

The light emitting device was produced in the same manner as that of Example 2-1, except that the thickness of the FTO film in Example 2-1 was made 50 nm and the grain size in the light emitting surface was made 10 nm.

Comparative Example 2-2

The light emitting device was produced in the same manner as that of Example 2-1, except that the thickness of the FTO film in Example 2-1 was made 1100 nm and the grain size in the light emitting surface was made 400 nm.

Evaluation and Evaluation Result

Figure 7:
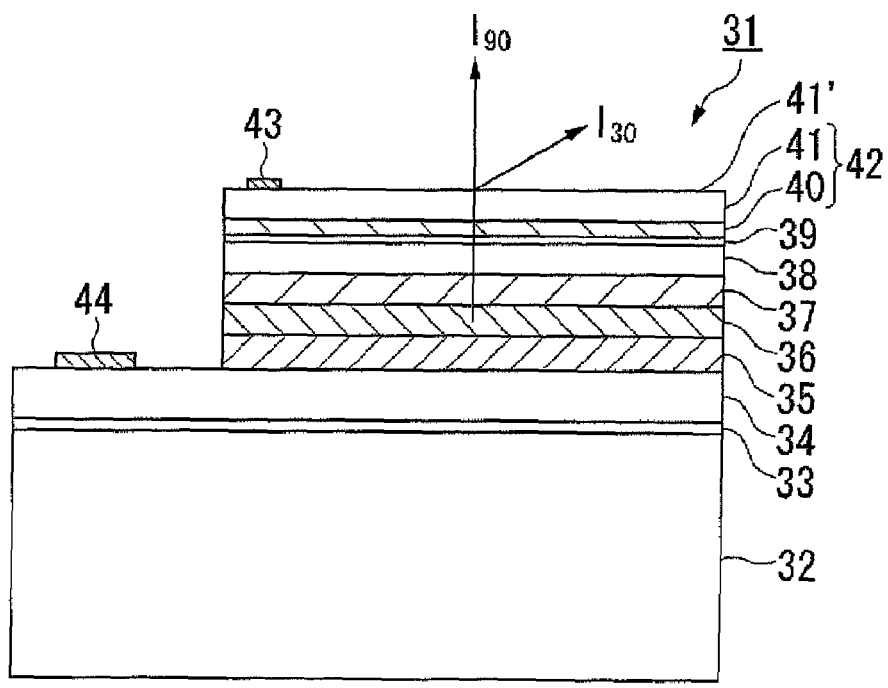
FIG. 7 shows an evaluation method of the exemplary embodiment of the second aspect of the present invention.

The light emitting devices produced in Examples 2-1 to 2-4 and Comparative Examples 2-1 and 2-2 were operated to emit light. As shown in FIG. 7, the intensity of light in the 90° (vertical) direction and the intensity of light in the 30° direction were measured. The evaluation was such that C is the ratio ($I_{30}/I_{90}$) of the intensity of light in the 30° direction to the intensity of light in the 90° (vertical) direction of less than 0.2, B is the ratio ($I_{30}/I_{90}$) of 0.2 or more and less than 0.5, and A is the ratio ($I_{30}/I_{90}$) of 0.5 or more. That is, it can be said that, as the ratio ($I_{30}/I_{90}$) becomes greater, polarization of the light according to the direction is decreased. The evaluation results are shown in Table 2.

TABLE 2

|  | Film thickness nm | Grain size nm | Evaluation result |
|---|---|---|---|
| Example 2-1 | 120 | 30 | B |
| Example 2-2 | 340 | 100 | A |
| Example 2-3 | 820 | 200 | A |
| Example 2-4 | 1100 | 300 | B |
| Comparative Example 2-1 | 50 | 10 | C |
| Comparative Example 2-2 | 1100 | 400 | C |

The transparent conductive film 40 in the inner layer was formed from two or more films comprising a TO film, a ZnO film, a SbZO film, or an FTO film, instead of the ITO film. The transparent conductive film 41 of the outermost layer was formed from the TO film, instead of the FTO film. All cases provided similar results to those of the ITO film and the FTO film. Moreover, the transparent conductive films were formed by a CVD method, a sputtering method, an evaporation method, a sol-gel method, and a paste application method, instead of the spray pyrolysis deposition method. All cases provided similar results to those of the spray pyrolysis deposition method.

Third Aspect

Figure 8:
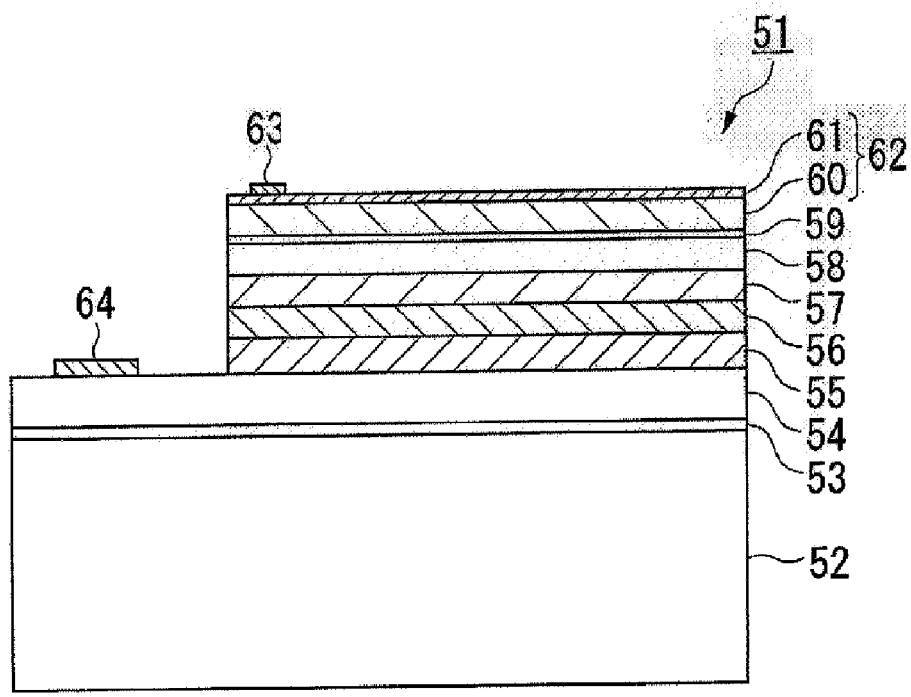
FIG. 8 is a cross-section showing an exemplary embodiment of a light emitting device according to a third aspect of the present invention.

FIG. 8 is a cross-section showing a first exemplary embodiment of a light emitting device according to a third aspect of the present invention.

In the light emitting device 51 of the third aspect of the present invention, on one surface (upper surface in FIG. 8) of a sapphire substrate 52 is provided an n-type GaN layer 54 having Si as a dopant via a GaN buffer layer 53, and via the n-type GaN layer 54 is provided an n-type AlGaN layer (main first conductivity type layer) 55 having Si as a dopant. Moreover, via this n-type AlGaN layer 55 is provided a light emitting portion 56 having a multiple quantum well (MQW) structure of InGaN and GaN, via the light emitting portion 56 is provided a p-type AlGaN layer (main second conductivity type layer) 57 containing Mg as a p-type dopant, via the p-type AlGaN layer 57 is provided a p-type GaN layer 58 containing Mg as a dopant as well, via the p-type GaN layer 58 is provided a metal thin film layer 59 formed from Ni, and via the metal thin film layer 59 is provided a two layer transparent conductor 62 of ITO film 60 and FTO film 61 sequentially laminated thereon. On a part of the periphery of the surface of the transparent conductor 62 is provided a p-side electrode 63. On the other hand, the respective layers laminated on a part of the periphery of the n-type GaN layer 54 are removed, and on the exposed n-type GaN layer 54 is provided an n-side electrode 64.

The light emitting device is formed by growing the respective layers by a vapor growth method such as metal-organic chemical vapor deposition (hereunder, referred to as a MOCVD method), and halide vapor phase epitaxy (HD-CVD).

In the MOCVD method, in the raw material gas, there are used, for example, trimethylgallium (TMG) as a gallium source, a hydrogen atom-containing compound such as ammonia ($NH_3$) and hydrazine as a nitrogen source, monosilane ($SiH_4$) as an Si source, trimethylaluminum (TMA) as an Al source, trimethylindium (TMI) as an In source, and biscyclopentadienylmagnesium ($Cp_2Mg$) as an Mg source. Hydrogen gas, nitrogen gas, and the like are used as a carrier gas.

The structure of the light emitting device may be such that on one surface of the substrate are sequentially laminated at least a first conductivity type layer, a second conductivity type layer, a metal thin film layer, and a transparent conductor as an electric current diffusion layer, including homo, single hetero, and double hetero structures. For example, a double hetero structure in which on the surface of a sapphire substrate are sequentially laminated, via a buffer layer: an n-type contact layer and an n-type cladding layer, a light emitting portion, a p-type cladding layer, a p-type contact layer, a metal thin film layer, and a transparent conductor as an electric current diffusion layer, is known as a light emitting device having a high level light emission.

Hereunder is a description of the case where the light emitting portion forms a layer. However, in the case of an interface emission, the interface between the n-type cladding layer and the p-type cladding layer functions as the light emitting portion.

The n-type contact layer can be formed from GaN which is undoped, or doped with an n-type dopant such as Si, Ge, S, and C. The n-type cladding layer can be formed from AlGaN, InAlGaN, or the like which is undoped, or doped with an n-type dopant.

The light emitting portion can be formed from InGaN, InAlGaN, or the like which is undoped, or doped with an n-type dopant and/or a p-type dopant such as Zn, Mg, Cd, and Ba. By forming the light emitting portion containing indium, the emission wavelength can be changed from ultraviolet to red. When an n-type dopant is doped in the light emitting portion, the emission intensity in the peak wavelength is further increased. When a p-type dopant is doped therein, the wavelength can be shifted to the approximately 0.5 eV long wavelength side. When an n-type dopant and a p-type dopant are doped therein, the wavelength can be shifted to the long wavelength side while keeping the emission intensity high.

The p-type cladding layer can be formed from AlGaN, InAlGaN, or the like doped with a p-type dopant. Moreover, the p-type contact layer can be formed from GaN-doped with a p-type dopant. Similarly to the n-type cladding layer, GaN can establish a good ohmic contact with an electrode. Moreover, the n-type cladding layer and/or the p-type cladding layer may be omitted. If omitted, the contact layer acts as the cladding layer.

In order to improve the ohmic contact with the p-type contact layer or the p-type cladding layer, preferably the metal thin film layer is formed from an alloy or a multilayered film containing a metal atom the same as the dopant doped in the p-type layer, such as an Mg atom. The metal thin film layer is formed by a deposition method or a sputtering method, and annealed at a predetermined temperature so as to achieve the ohmic contact. Of course, in order to avoid the reduction in the light transmissivity, the upper limit is set for the thickness of the metal thin film layer.

The transparent conductor is mainly formed from an indium tin oxide film (hereunder referred to as an ITO film) due to the high conductivity and high transmittance thereof, and a fluorine-doped tin oxide film (hereunder referred to as an FTO film) is laminated thereon as the heat resistant protective film.

In many cases, an ITO film is formed by a low pressure sputtering method, and an FTO film is formed by an atmospheric CVD method. However, when different production methods are respectively used for forming the ITO film and the FTO film, the number of steps are increased, causing a cost increment. Therefore, a spray pyrolysis deposition method (hereunder, referred to as a SPD method) capable of forming both of the ITO film and the FTO film in atmospheric air, is preferably used.

The SPD method is a film forming method in which a raw material liquid is applied onto a heated substrate by spraying so as to cause pyrolysis and chemical reaction on the substrate surface. The method is capable of forming a film in atmospheric air, and thus is preferably used in terms of reduction of the production cost.

In exemplary embodiments of the present invention, the ITO film is formed by spraying an ethanol solution of indium chloride (hydrate) and tin chloride (hydrate), on a heated substrate at 350° C. The blending is preferably performed so that the tin dosage is 5% by atom with respect to indium in element ratio. The resultant film is a highly conductive and highly transmissive thin film of a thickness of about 100 nm to 1000 nm.

In forming the FTO film, a mixed solution of an ethanol solution of tin chloride (hydrate) and a saturated aqueous solution of ammonium fluoride was sprayed on a heated substrate at no less than 400° C. and no more than 700° C. The doping is preferably performed so that the fluorine dosage is about several ppm to several thousands ppm with respect to tin. The resultant film is a highly heat resistant and highly chemical resistant thin film of a thickness of about 50 nm to 300 nm.

The film formation of the FTO film is started from a temperature of over 400° C. In order to obtain the ohmic contact, the temperature is increased during the FTO film formation, or after the FTO film formation, and the upper limit is 700° C. When the FTO film is formed to 10 nm or more, the heat resistance of the transparent conductive film is improved, and thus even if the film is held at a temperature of over 500° C. during the film formation, the electrical conduction property is not deteriorated and the initial condition can be maintained. However, if the temperature for forming the FTO film becomes lower than 400° C., the metal thin film layer 59 is insufficiently heated, and the ohmic contact of the metal thin film layer 59 cannot be achieved, and thus 400° C. is the lower limit.

Since both of the ITO film and the FTO film can be formed by the same SPD method, then uninteruptedly after forming the ITO film (without taking out the sample from the SPD film forming device), the temperature of the substrate is increased and the heating is kept at a predetermined temperature to form the FTO film.

In this manner, by heating for forming the FTO film, the metal thin film layer directly under the ITO film can be also heated to achieve the ohmic contact. Therefore, annealing for achieving the ohmic contact in a separate step becomes unnecessary, and a reduction in the production steps and a reduction in the production cost can be expected.

After the transparent conductor is formed, the p-side electrode and the n-side electrode are formed. The p-side electrode is formed at a predetermined site on the surface of the transparent conductor. However, regarding the n-side electrode, if an insulative substrate of such as sapphire is used for the substrate, no electrode can be provided on the other surface of the substrate. Thus, both of the p-side electrode and the n-side electrode have to be provided on one surface side where the compound layer, the metal thin film layer, and the transparent conductor are laminated. For this purpose, the transparent conductor, the metal thin film layer, the p-type contact layer, the p-type cladding layer, the light emitting portion, and the n-type cladding layer are etched to expose the n-type contact layer, and on the exposed part is formed the n-side electrode.

Either wet etching or dry etching may be used for etching the respective layers. In the wet etching, for example a mixed acid of phosphoric acid and sulfuric acid may be used. In the dry etching, for example, reactive ion etching, focused ion beam etching, ion milling, and ECR (electron cyclotron resonance) etching may be used. In reactive ion etching or ECR etching, a gas such as $CF_4$, $CCl_4$, $SiCl_4$, $CClF_3$, $CClF_2$, $SF_6$, and $PCl_3$ may be used as an etching gas. In focused ion beam etching, B, Al, Si, Ga, Ge, In or the like may be used as a metal ion source. In ion milling, an inert gas such as Ar, Ne, and $N_2$ may be used.

The etching may involve selecting an optimum etching method for each layer, and respectively masking and etching each layer. However, the light emission area is decreased as the number of times of photolithography is increased. Thus, a preferable method involves using a gas containing chlorine gas or a gas containing bromine gas, and etching all at once the transparent conductor, the metal thin film layer, the p-type contact layer, the p-type cladding layer, the light emitting portion, and the n-type cladding layer, to expose the n-type contact layer.

In exemplary embodiments of the present invention, for the transparent conductive film serving as the lowest layer, there may be used a transparent conductive film formed from indium oxide (IO), zinc oxide (ZO), antimony-doped zinc oxide (SbZO), Ga-doped zinc oxide (GZO), aluminum-doped zinc oxide (AlZO), boron-doped zinc oxide (BZO), or the like, rather than indium tin oxide (ITO). Moreover, for the transparent conductive film serving as at least one layer in the upper layer, there may be used a film formed from tin oxide (TO) rather than fluorine-doped tin oxide (FTO).

By forming the transparent conductive film serving as the lowest layer from a film comprising indium tin oxide (ITO), indium oxide (IO), zinc oxide (ZO), antimony-doped zinc oxide (SbZO), Ga-doped zinc oxide (GZO), aluminum-doped zinc oxide (AlZO), or boron-doped zinc oxide (BZO), high conductivity and high transmittance can be exhibited. On the other hand, by forming the transparent conductive film serving as at least one layer in the upper layer from a film comprising tin oxide (TO) or fluorine-doped tin oxide (FTO), high heat resistance can be exhibited. As a result, the transparent conductive film serving as the lowest layer can be kept from being oxidized, and the high conductivity and high transmittance of the transparent conductive film can be maintained.

In particular, by forming the transparent conductive film serving as the lowest layer from an indium tin oxide (ITO) film, high conductivity and high transmittance can be exhibited. By forming the transparent conductive film serving as at least one layer in the upper layer from a fluorine-doped tin oxide (FTO) film, higher heat resistance can be exhibited. Therefore, the indium tin oxide (ITO) film serving as the lowest layer can be kept from being oxidized, and the high conductivity and high transmittance of the transparent conductive film can be stably maintained for a long time.

Moreover, by heating for forming at least one layer in the upper layer, the contact resistance of the metal thin film layer with the second conductivity type layer becomes an order of $10^{-4}$ $\Omega \cdot cm^2$ or less. Therefore the ohmic contact can be achieved without annealing in a separate step.

Since both of the abovementioned transparent conductive film serving as the lowest layer, and the transparent conductive film serving as at least one layer in the upper layer are formed by a spray pyrolysis deposition method, and the production thereof in atmospheric air is possible, then a depressurization system (film formation in a depressurized atmosphere) becomes unnecessary, and thus the production cost can kept low.

Furthermore, since the grain size of the film formed by the spray pyrolysis deposition method is greater than a normally sputtered film, then, when the film is formed on the light emitting device, total reflection of the emitting light hardly occurs. Therefore it becomes possible to provide a light emitting device having little variation in intensity of the light according to the direction.

In particular, the indium tin oxide (ITO) film and the fluorine-doped tin oxide (FTO) film can be formed stably in atmospheric air using the spray pyrolysis deposition method. Furthermore, since the indium tin oxide (ITO) film and the fluorine-doped tin oxide (FTO) film can be uninteruptedly and stably formed, not only the production cost can be reduced, but also the stability of the quality can be improved.

Since the temperature of the surface (the surface of the metal thin film layer) on which the indium tin oxide (ITO) film is to be formed, is low, then elements for forming the metal thin film layer are not evaporated, avoiding the metal thin film layer from becoming thinner or vanishing. Moreover, since the temperature of the surface on which the fluorine-doped tin oxide (FTO) film is to be formed, is no less than 400° C. and no more than 700° C., then when the fluorine-doped tin oxide (FTO film) is formed, the underlying metal thin film layer is sufficiently heated, achieving the ohmic contact between the metal thin film layer and the second conductivity type layer.

Example 3-1

The light emitting device 51 according to the first exemplary embodiment of the third aspect of the present invention was formed in the following manner.

On one surface of the sapphire substrate 52 were formed respective GaN type compound layers by the MOCVD method. In the raw material gas, there were used a trimethylgallium (TMG) gas for Ga, an ammonia ($NH_3$) gas for N, a mono-silane ($SiH_4$) gas for Si, a trimethylaluminum (TMA) gas for Al, a trimethylindium (TMI) gas for In, and a biscyclopentadienylmagnesium ($Cp_2Mg$) gas for Mg. Hydrogen gas was used as a carrier gas.

Firstly, in a MOCVD device was set a sapphire substrate 52 having the (0001) plane as the compound depositional surface with a diameter of 2 inches. A thermal cleaning was performed by heating at 1050° C. with a supply of hydrogen. Next, the sapphire substrate 52 was cooled down to 510° C., and the GaN buffer layer 53 was deposited to a thickness of 25 nm thereon. Then, the sapphire substrate 52 provided with the GaN buffer layer 53 was heated to 1035° C., and an $NH_3$ gas, a TMG gas, and an $SiH_4$ gas were introduced to grow the n-type GaN layer 54 having Si as a dopant. Then, an $NH_3$ gas, a TMG gas, a TMA gas, and an $SiH_4$ gas were introduced to form the n-type AlGaN layer 55 having Si as a dopant.

Next, the temperature of the sample was set to 750° C., and a TMA gas was intermittently introduced, to grow the light emitting portion 56 to a thickness of about 40 nm having a multiple quantum well (MQW) structure of GaN and AlGaN, on the n-type AlGaN layer 55.

Subsequently, an $NH_3$ gas, a TMG gas, a TMA gas, and a $Cp_2Mg$ gas were introduced to form the p-type AlGaN layer 57 having Mg as a dopant on the light emitting portion 56. Then, an $NH_3$ gas, a TMG gas, and $Cp_2Mg$ gas were introduced to form the p-type GaN layer 58 having Mg as a dopant. After forming this p-type GaN layer 58, Ni was deposited to 5 μm by a deposition method to provide the metal thin film layer 59.

Next, the sample was moved to the SPD film forming device, the metal thin film layer 59 was heated and held at 350° C., and a raw material compound solution for ITO film was sprayed onto the metal thin film layer 59 by the SPD method, to form the ITO transparent conductive film 60 to a thickness of 700 nm. After forming the ITO film, uninteruptedly, heating-up was started until the temperature reached 550° C. When the surface of the ITO film 60 exceeded 400° C., spraying of the raw material compound solution for FTO film formation was started to form the FTO film 61 to a thickness of 100 nm, so as to form the transparent conductor 62. Including the time during the film formation and after the film formation, the condition where the surface of the ITO transparent conductive film 60 was kept at 550° C. was continued for 10 minutes or more.

The raw material compound solution for ITO film was obtained by dissolving 5.58 g of indium chloride (III) tetrahydrate and 0.23 g of tin chloride (II) dihydrate in 100 ml of ethanol.

The raw material compound solution for FTO film 61 was obtained by dissolving 0.701 g of tin chloride (IV) pentahydrate in 10 ml of ethanol, adding a saturated aqueous solution of 0.592 g of ammonium fluoride, and then placing the mixture in an ultrasonic cleaning apparatus for about 20 minutes, to effect complete dissolution.

Next, a mask was formed on the transparent conductor 62, in order to remove the n-type AlGaN layer 55, the light emitting portion 56, the p-type AlGaN layer 57, the p-type GaN layer 58, the metal thin film layer 59, and the transparent conductor 62 laminated on a part to be formed with the n-side electrode 64, so as to form the n-side electrode 64 on the periphery of one surface of the n-type GaN layer 54. After the mask was formed, the sample was moved to the etching apparatus, and an etching gas was let therein to perform dry etching until the n-type GaN layer 54 was exposed.

On the n-type GaN layer 54 that had been exposed by the dry etching, Al was deposited to a thickness of about 4 μm to form the n-side electrode 63 by the deposition method. On a part of the periphery of the transparent conductor 62 (FTO film 61) from which the mask had been peeled off, Al was deposited to a thickness of about 0.8 μm to provide the p-side electrode 64.

The sapphire substrate 52 formed with this gallium nitride compound layer was diced into a 300 μm×300 μm square to form a bare chip. This bare chip was installed on a stem by means of die bonding, and wiring was performed by means of wire bonding to produce the light emitting device 51.

Example 3-2

The light emitting device 51 was produced in the same manner as that of Example 3-1, except that only the temperature for forming the FTO film 61 in the transparent conductor 62 was changed to 400° C.

Example 3-3

The light emitting device 51 was produced in the same manner as that of Example 3-1, except that only the temperature for forming the FTO film 61 in the transparent conductor 62 was changed to 700° C.

Example 3-5

The light emitting device 51 was produced in the same manner as that of Example 3-1, except that only the temperature for forming the FTO film 61 in the transparent conductor 62 was changed to 350° C.

Comparative Examples 3-1

The light emitting device 51 was produced in the same manner as that of Example 3-1, except that only the temperature for forming the FTO film 61 in the transparent conductor 62 was changed to 750° C.

Comparative Examples 3-2

The light emitting device 51 was produced in the same manner as that of Example 3-1, except that the transparent conductor 62 was changed into the ITO transparent conductive film 60 (one layer) only.

Figure 9:
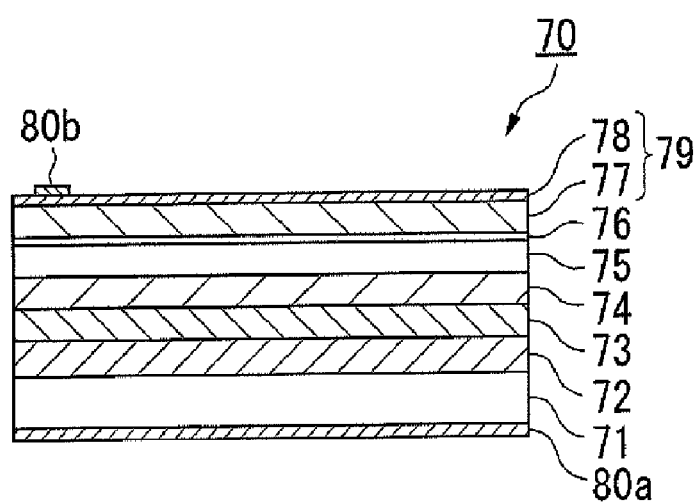
FIG. 9 a cross-section showing another exemplary embodiment of a light emitting device according to the third aspect of the present invention.

FIG. 9 is a cross-section showing a second exemplary embodiment of the light emitting device of the third aspect of the present invention.

On one surface of an n-type GaAs substrate 71 as the first conductivity type substrate are sequentially provided an n-type AlGaInP cladding layer (main first conductivity type layer) 22, an AlGaInP light emitting portion 73, a p-type AlGaInP cladding layer (main second conductivity type layer) 74, a p-type AlGaInP current dispersion layer 75, a metal thin film layer 76 formed film Au/Ni, and a transparent conductor 79 formed from an ITO transparent conductive film 77 and an FTO film 78. On the other surface of the n-type GaAs substrate 71 is provided an n-side electrode 80a. On the periphery of the surface of the transparent conductor 79 is provided a circular p-side electrode 80b.

Example 3-4

The light emitting device 70 according to the second exemplary embodiment of the third aspect of the present invention was formed in the following manner.

Firstly, on the n-type GaAs substrate 71 were sequentially formed the n-type AlGaInP cladding layer 72, the AlGaInP light emitting portion 73, the p-type AlGaInP cladding layer 74, and the p-type AlGaInP current dispersion layer 75, by the MOCVD method. On the p-type AlGaInP current dispersion layer 75 was provided a metal thin film layer 76 formed from Au/Ni with an underlayer of Ni by the deposition method.

On the surface of this metal thin film layer 76 was formed the ITO transparent conductive film 77 by the SPD method. The metal thin film layer 76 was heated and held at 350° C., onto which the raw material compound solution for ITO film was sprayed by the SPD method to form the ITO film 77 to a thickness of 700 nm.

The raw material compound solution for ITO film was obtained by dissolving 5.58 g of indium chloride (III) tetrahydrate and 0.23 g of tin chloride (II) dihydrate, in 100 ml of ethanol.

After forming the ITO transparent conductive film 77, uninteruptedly, heating-up was started until the temperature reached 550° C. When the surface of the ITO film 77 exceeded 440° C., the raw material compound solution for FTO film was sprayed to form the FTO film 78 to a thickness of 100 nm, so as to form the transparent conductor 79.

The raw material compound solution for FTO film 78 was obtained by dissolving 0.701 g of tin chloride (IV) pentahydrate in 10 ml of ethanol, adding a saturated aqueous solution of 0.592 g of ammonium fluoride, and then placing the mixture in an ultrasonic cleaning apparatus for about 20 minutes, to effect complete dissolution.

On this transparent conductor 79 was formed the p-side electrode 80b of Au/Ni by photolithography. On the other surface of the GaAs substrate 71 was formed the n-side electrode 80a of AuGe/Ni/Au.

The wafer that had been laminated in this manner was diced into a 300 μm×300 μm square to form a bare chip. This bare chip was installed on a stem by means of die bonding, and wiring was performed by means of wire bonding to produce the light emitting device 70.

Comparative Example 3-3

The light emitting device was produced in the same manner as that of Example 3-4, except that the transparent conductor 62 was changed into the ITO transparent conductive film 60 (one layer) only.

Evaluation Method

The evaluation was performed for the light emitting device formed in the respective Examples and the respective Comparative Examples, by measuring the specific resistance of the transparent conductor before and after a heat treatment at 500° C. for 1 hour, and measuring the contact resistance between the transparent conductor and the second conductivity type layer via the metal thin film layer.

Evaluation Result

The evaluation results are shown in Table 3.

TABLE 3

| | Substrate material | Transparent conductor structure | FTO film forming temp (° C.) | Specific resistance (Ω · cm²) | | Specific resistance (Ω · cm²) | |
|---|---|---|---|---|---|---|---|
| | | | | Before heat treatment | After heat treatment | Before heat treatment | After heat treatment |
| Example 3-1 | Sapphire | FTO film/ITO film | 550 | $1.5 \times 10^{-4}$ | $1.5 \times 10^{-4}$ | $7.3 \times 10^{-4}$ | $7.3 \times 10^{-4}$ |
| Example 3-2 | Sapphire | FTO film/ITO film | 400 | $1.4 \times 10^{-4}$ | $1.4 \times 10^{-4}$ | $9.0 \times 10^{-4}$ | $7.3 \times 10^{-4}$ |
| Example 3-3 | Sapphire | FTO film/ITO film | 700 | $1.5 \times 10^{-4}$ | $1.5 \times 10^{-4}$ | $7.0 \times 10^{-4}$ | $7.0 \times 10^{-4}$ |
| Example 3-4 | GaAs | FTO film/ITO film | 550 | $1.5 \times 10^{-4}$ | $1.5 \times 10^{-4}$ | $7.3 \times 10^{-4}$ | $7.3 \times 10^{-4}$ |
| Example 3-5 | Sapphire | FTO film/ITO film | 350 | $1.4 \times 10^{-4}$ | $1.4 \times 10^{-4}$ | Non-ohmic | $7.3 \times 10^{-4}$ |
| Comparative Example 3-1 | Sapphire | FTO film/ITO film | 750 | $7.0 \times 10^{-4}$ | $7.0 \times 10^{-4}$ | $9.5 \times 10^{-4}$ | $9.5 \times 10^{-4}$ |
| Comparative Example 3-2 | Sapphire | ITO film | — | $1.4 \times 10^{-4}$ | $7.5 \times 10^{-4}$ | Non-ohmic | $7.3 \times 10^{-4}$ |
| Comparative Example 3-3 | GaAs | ITO film | — | $1.4 \times 10^{-4}$ | $7.5 \times 10^{-4}$ | Non-ohmic | $7.0 \times 10^{-4}$ |

Heat treatment condition: 500° C. × 1 hour

In Examples 3-1 to 3-4, the specific resistance of the transparent conductor was hardly changed before and after the heat treatment at 500° C. for 1 hour, within a range of $1.4 \times 10^{-4}$ to $1.5 \times 10^{-4}$ Ω·cm, and satisfied the requirement as a transparent conductor. The reason is that: since the FTO film serving as the upper layer had a sufficient heat resistance, even if the heat treatment at 500° C. for 1 hour was performed, the FTO film prevented the oxidization of the ITO transparent conductive film in the lower layer, and thus the specific resistance was not changed.

On the other hand, in Examples 3-1 to 3-4, the contact resistance between the transparent conductor and the first conductivity type layer via the metal thin film layer was $7.0 \times 10^{-4}$ Ω·cm² to $9.0 \times 10^{-4}$ Ω·cm² both before and after the heat treatment at 500° C. for 1 hour. The ohmic contact had been achieved even before the heat treatment at 500° C. for 1 hour. The reason is that the ohmic contact between the metal thin film layer and the first conductivity type layer was achieved by heating for forming the FTO film in the upper layer of the transparent conductor.

Examples 3-5 is a case where the transparent conductor comprises a double layer structure of the ITO film and the FTO film, and the temperature for forming the FTO film is low (350° C.). The specific resistance of the transparent conductor formed under such a condition was $1.4 \times 10^{-4}$ Ω·cm before and after the heat treatment at 500° C. for 1 hour, and regarded as satisfactory as the transparent conductor, similarly to the cases of the abovementioned Examples 3-1 to 3-4. Moreover, regarding the contact resistance between the transparent conductor and the first conductivity type layer via the metal thin film layer, although the ohmic contact was not achieved before the heat treatment, the ohmic contact ($7.3 \times 10^{-4}$ Ω·cm) was achieved after the heat treatment at 500° C. for 1 hour, providing the equivalent results to those of the cases of Examples 3-1 to 3-4. Therefore, it is found that, as with the Examples 3-5, even if the temperature for forming the FTO film is low, a light emitting device having a satisfactory light emission can be formed by performing a post heat treatment.

In the Comparative Examples 3-1, although the ohmic contact was achieved before the heat treatment at 500° C. for 1 hour, the specific resistance of the transparent conductor was as high as $7.0 \times 10^{-4}$ Ω·cm both before and after the heat treatment at 500° C. for 1 hour. The reason is considered that: since the temperature of the surface (of the ITO film) on which the FTO film was to be formed, was as high as 750° C., the ITO transparent conductive film had been oxidized during the heating-up process of the ITO transparent conductive film to 750° C., after forming the ITO transparent conductive film at 350° C. Consequently, the Comparative Example 3-1 is unfavorable as a production condition for the light emitting device.

In the Comparative Examples 3-2 and 3-3, although the specific resistance of the transparent conductor was a preferable value of $1.4 \times 10^{-4}$ Ω·cm before the heat treatment at 500° C. for 1 hour, the ohmic contact between the transparent conductor and the first conductivity type layer via the metal thin film layer was not achieved. Therefore, when the heat treatment at 500° C. for 1 hour was performed, the ohmic contact between the transparent conductor and the first conductivity type layer via the metal thin film layer was achieved, however the specific resistance of the transparent conductor was increased to $7.5 \times 10^{-4}$ Ω·cm, and thus the Comparative Examples 3-2 and 3-3 are unfavorable. The reason is that only one layer of the transparent conductor formed from the ITO film did not have heat resistance, and thus the ITO film was oxidized.

As described above, similarly to the third exemplary embodiment of the present invention, when the lowest layer of the transparent conductor is formed from the ITO transparent conductive film and at least one layer in the upper layer is formed from the FTO film, the ohmic contact of the metal thin film layer can be achieved by heating for forming the FTO film. Therefore, annealing of the metal thin film layer in a separate step becomes unnecessary, and an effect of reducing the production cost can be expected. Moreover, since the FTO film in the upper layer has heat resistance, after forming the transparent conductor, even if heating is applied up to 700° C., the specific resistance of the ITO transparent conductive film is not increased, and the function as a transparent conductor can be demonstrated.

As described above, the FTO film that has been formed as at least one layer in the upper layer of the transparent conductor in the light emitting device of the third exemplary embodiment of the present invention, has sufficient heat resistance, and can be utilized not only as the protective film for the transparent conductive film of the light emitting device, but also as a protective film for a transparent conductive film of a dye-sensitized solar cell.

While exemplary embodiments of the present invention have been described above, these are not considered to be limitative of the invention. Addition, omission, and replacement of the constituents, and other modifications can be made without departing from the spirit or scope of the invention. The present invention is not limited by the descriptions above, but is limited only by the appended claims and their legal equivalents.

The invention claimed is:

1. A light emitting device, comprising:
   a laminated body comprising a first conductivity type layer, a second conductivity type layer, and a light emitting portion disposed between the first conductivity type layer and the second conductivity type layer;
   a metal thin film layer on the second conductivity type layer; and
   a transparent conductor on the metal thin film layer,
   wherein the transparent conductor comprises two or more transparent conductive films, and a grain size in a light emitting surface of a transparent conductive film serving as an outermost layer is not less than 30 nm and not greater than 300 nm.

2. A light emitting device according to claim 1, wherein the grain size is not less than 100 nm and not greater than 200 nm.

3. A method of manufacturing a light emitting device, comprising:
   forming a laminated body comprising a first conductivity type layer, a second conductivity type layer, and a light emitting portion disposed between the first conductivity type layer and the second conductivity type layer;
   forming a metal thin film layer on the second conductivity type layer;
   forming a transparent conductor comprising two or more layers of transparent conductive films on the metal thin film layer; and
   controlling a grain size in a light emitting surface of a transparent conductive film serving as an outermost layer by changing a thickness of the transparent conductive film serving as the outermost layer.

4. A light emitting device, comprising:
   a laminated body comprising a first conductivity type layer, a second conductivity type layer, and a light emitting portion disposed between the first conductivity type layer and the second conductivity type layer;
   a metal thin film layer on the second conductivity type layer; and
   a transparent conductor on the metal thin film layer,
   wherein the transparent conductor comprises two or more transparent conductive films, and a transparent conductive film serving as at least one layer in an upper layer has a higher heat resistance than a transparent conductive film serving as a lowest layer.

5. A light emitting device according claim 4, wherein the transparent conductive film serving as the lowest layer is formed from indium tin oxide (ITO), indium oxide (IO), zinc oxide (ZO), antimony-doped zinc oxide (SbZO), Ga-doped zinc oxide (GZO), aluminum-doped zinc oxide (AlZO), or boron-doped zinc oxide (BZO); and
   the transparent conductive film serving as the at least one layer in the upper layer is formed from tin oxide (TO) or fluorine-doped tin oxide (FTO).

6. A light emitting device according claim 5, wherein the transparent conductive film serving as the lowest layer is formed from an indium tin oxide (ITO) film, and the transparent conductive film serving as the at least one layer in the upper layer is formed from a fluorine-doped tin oxide (FTO) film.

7. A light emitting device according claim 4, wherein a contact resistance of the metal thin film layer with the second conductivity type layer is not great than $10^{-4}$ $\Omega \cdot cm^2$.

8. A method of manufacturing a light emitting device, comprising:
   forming a laminated body comprising a first conductivity type layer, a second conductivity type layer, and a light emitting portion disposed between the first conductivity type layer and the second conductivity type layer;
   forming a metal thin film layer on the second conductivity type layer; and
   forming a transparent conductor on the metal thin film layer,
   wherein forming the transparent conductor comprises:
      forming a transparent conductive film serving as a lowest layer from indium tin oxide (ITO), indium oxide (IO), zinc oxide (ZO), antimony-doped zinc oxide (SbZO), Ga-doped zinc oxide (GZO), aluminum-doped zinc oxide (AlZO), or boron-doped zinc oxide (BZO), and by a spray pyrolysis deposition method; and
      forming a transparent conductive film serving as at least one layer in said upper layer from tin oxide (TO) or fluorine-doped tin oxide (FTO), and by a spray pyrolysis deposition method.

9. A manufacturing method of a light emitting device according claim 8, wherein the transparent conductive film serving as the lowest layer is formed from an indium tin oxide (ITO) film, and the transparent conductive film serving as the at least one layer in the upper layer is formed from a fluorine-doped tin oxide (FTO) film.

10. A manufacturing method of a light emitting device according claim 9, wherein a temperature of a surface on which the fluorine-doped tin oxide (FTO) film is to be formed, is higher than a temperature of a surface on which the indium tin oxide (ITO) film is to be formed.

11. A manufacturing method of a light emitting device according claim 10, wherein the temperature of the surface on which the fluorine-doped tin oxide (FTO) film is to be formed is not less than 400° C. and not greater than 700° C.

* * * * *